United States Patent
Ghosh Dastider et al.

(10) Patent No.: US 12,077,431 B2
(45) Date of Patent: Sep. 3, 2024

(54) MEMS DEVICE HAVING DECREASED CONTACT RESISTANCE

(71) Applicant: Qorvo US, Inc., Greensboro, NC (US)

(72) Inventors: Shibajyoti Ghosh Dastider, Roseville, CA (US); Mickael Renault, San Jose, CA (US); Jacques Marcel Muyango, Rocklin, CA (US)

(73) Assignee: Qorvo US, Inc., Greensboro, NC (US)

( * ) Notice: Subject to any disclaimer, the term of this patent is extended or adjusted under 35 U.S.C. 154(b) by 312 days.

(21) Appl. No.: 17/608,822

(22) PCT Filed: May 29, 2020

(86) PCT No.: PCT/US2020/035263
§ 371 (c)(1),
(2) Date: Nov. 4, 2021

(87) PCT Pub. No.: WO2020/243529
PCT Pub. Date: Dec. 3, 2020

(65) Prior Publication Data
US 2022/0289565 A1 Sep. 15, 2022

Related U.S. Application Data

(60) Provisional application No. 62/854,826, filed on May 30, 2019.

(51) Int. Cl.
*B81C 1/00* (2006.01)
*B81B 3/00* (2006.01)

(52) U.S. Cl.
CPC .......... *B81C 1/00325* (2013.01); *B81B 3/001* (2013.01); *B81C 1/00523* (2013.01);
(Continued)

(58) Field of Classification Search
CPC .... B81C 1/00325; B81C 1/00523; B81B 3/00
See application file for complete search history.

(56) References Cited

U.S. PATENT DOCUMENTS

| 2002/0088112 A1 | 7/2002 | Morrison, Jr. et al. |
| 2012/0175715 A1 | 7/2012 | Hammond et al. |

(Continued)

FOREIGN PATENT DOCUMENTS

| JP | 2009510707 A | 3/2009 |
| JP | 2014045030 A | 3/2014 |

(Continued)

OTHER PUBLICATIONS

International Search Report and Written Opinion for PCT/US2020/035263, mailed Aug. 31, 2020, 14 pages.
(Continued)

*Primary Examiner* — Samuel A Gebremariam
(74) *Attorney, Agent, or Firm* — Withrow & Terranova, P.L.L.C.

(57) ABSTRACT

A method of manufacturing a MEMS device, wherein the MEMS device has a cavity in which a beam will move to change the capacitance of the device. After most of the device build-up has occurred, sacrificial material is removed to free the beam within the MEMS device cavity. Thereafter, exposed ruthenium contacts are etched back with an etchant comprising chlorine to remove the top surface of both the top and bottom contacts. Due to this etch back process, low contact resistance can be achieved with less susceptibility to stiction events. Stiction performance can be further improved by conditioning the ruthenium contacts in a fluorine based plasma. The fluorine based plasma process, or fluorine treatment, can be performed prior to or after etchback process of the ruthenium contacts.

12 Claims, 4 Drawing Sheets

(52) U.S. Cl.
CPC ............ *B81B 2203/0315* (2013.01); *B81C 2203/0145* (2013.01)

(56) References Cited

U.S. PATENT DOCUMENTS

| | | |
|---|---|---|
| 2014/0076697 A1 | 3/2014 | Gupta et al. |
| 2014/0264655 A1 | 9/2014 | Williams et al. |
| 2017/0305738 A1 | 10/2017 | Chang et al. |

FOREIGN PATENT DOCUMENTS

| | | |
|---|---|---|
| JP | 2016062984 A | 4/2016 |
| WO | 2008/064216 A2 | 5/2008 |

OTHER PUBLICATIONS

Second Written Opinion for International Patent Application No. PCT/US2020/035263, mailed Nov. 26, 2020, 6 pages.
International Preliminary Report on Patentability for PCT/US2020/035263, mailed Feb. 22, 2021, 13 pages.
Notice of Reason for Rejection for Japanese Patent Application No. 2021566474, mailed Jun. 5, 2024, 13 pages.

MEMS DEVICE HAVING DECREASED CONTACT RESISTANCE

This application is a 35 USC 371 national phase filing of International Application No. PCT/US2020/035263, filed May 29, 2020, which claims the benefit of U.S. Provisional Application No. 62/854,826, filed May 30, 2019, the disclosures of which are incorporated herein by reference in their entireties.

FIELD OF THE DISCLOSURE

Embodiments of the present disclosure generally relate to a method for decreasing contact resistance while preventing stiction in a micro-electromechanical system (MEMS) device comprising one or more ruthenium contacts.

BACKGROUND

Contact sticking, or stiction, is one of the dominant failure mechanisms in MEMS devices. Stiction is one of the key challenges in fabricating viable MEMS devices. Ruthenium contacts provide low resistance, durable contacts, but ruthenium contacts are susceptible to potential stiction events over operating life.

Therefore, there is a need to have low resistance, durable contacts that are less susceptible to stiction events.

SUMMARY

The present disclosure generally relates to a method of manufacturing a MEMS device. The MEMS device has a cavity in which a beam will move to change the capacitance of the device. After most of the device build-up has occurred, sacrificial material is removed to free the beam within the MEMS device cavity. Thereafter, exposed ruthenium contacts are etched back with an etchant comprising chlorine to remove the top surface of both the top and bottom contacts. Due to this etch back process, low contact resistance can be achieved with less susceptibility to stiction events. Stiction performance can be further improved by conditioning the ruthenium contacts in a fluorine based plasma. The fluorine based plasma process, or fluorine treatment, can be performed prior to or after etch-back process of the ruthenium contacts.

In one embodiment, a method of manufacturing a MEMS device comprises: forming one or more electrical contact stacks comprising a contact surface of ruthenium within a cavity; forming a beam structure over the one or more electrical contact stacks within the cavity, wherein the cavity contains sacrificial material; removing the sacrificial material from the cavity to free the beam to move within the cavity; etching a portion of the contact surface of ruthenium using an etchant comprising chlorine; and sealing the cavity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
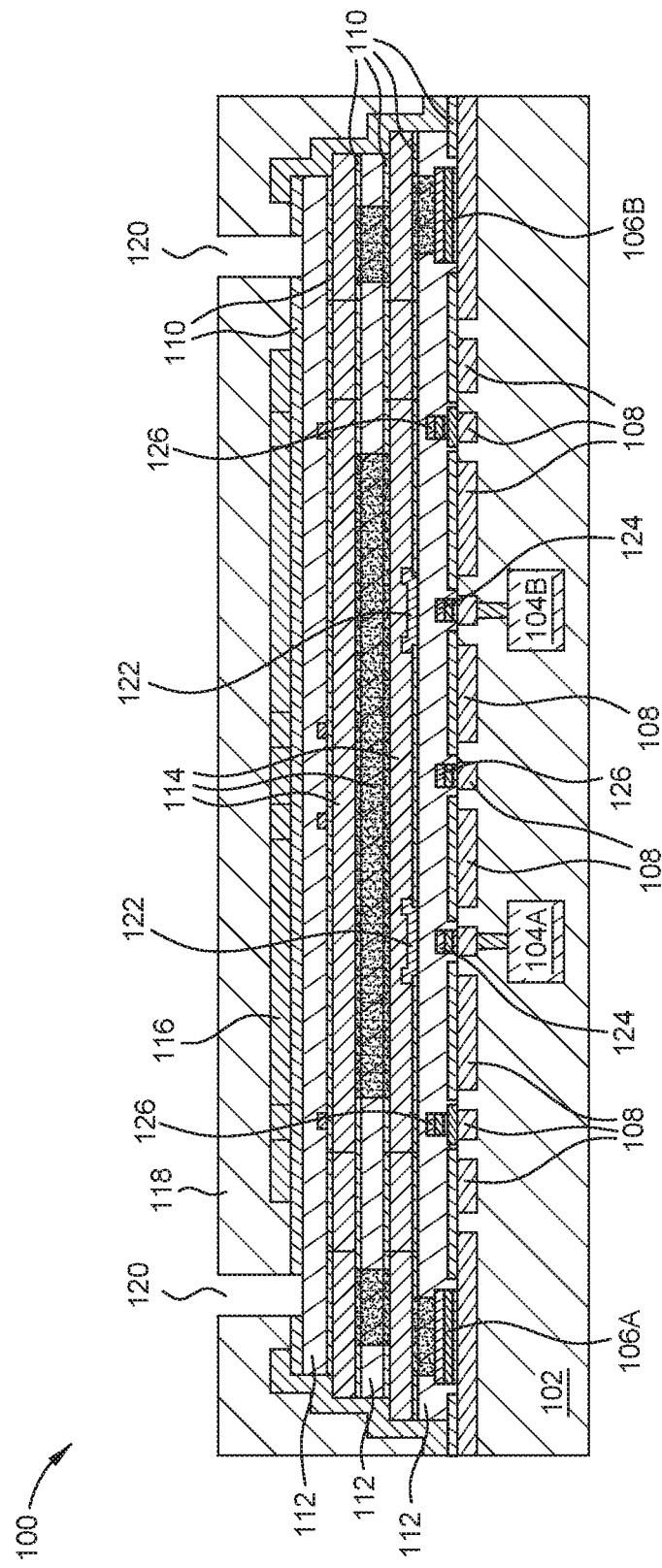
FIG. 1 is a schematic illustration of a MEMS device prior to removing sacrificial material and releasing the beam.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure generally relates to a method of manufacturing a MEMS device. The MEMS device has a cavity in which a beam will move to change the capacitance of the device. After most of the device build-up has occurred, sacrificial material is removed to free the beam within the MEMS device cavity. Thereafter, exposed ruthenium contacts are etched back with an etchant comprising chlorine to remove the top surface of both the top and bottom contacts. Due to this etch back process, low contact resistance can be achieved with less susceptibility to stiction events. Stiction performance can be further improved by conditioning the ruthenium contacts in a fluorine based plasma. The fluorine based plasma process, or fluorine treatment, can be performed prior to or after etch-back process of the ruthenium contacts.

FIG. 1 is a schematic illustration of a MEMS device 100 prior to removing sacrificial material and releasing the beam. The MEMS device 100 includes a substrate 102, such as a CMOS substrate that includes numerous layers for a semiconductor device. It is also contemplated that the substrate 102 may simply be a semiconductor substrate containing silicon, germanium, or other suitable semiconductor material.

Within the substrate, one or more contact electrodes 104A, 104B are present. The contact electrodes 104A, 104B may be RF conductors or RF electrodes. It is to be understood that while two contact electrodes 104A, 104B are shown, a single contact electrode, or even more than two contact electrodes is contemplated. The contact electrodes 104A, 104B may be comprised of any conductive material suitable for use in a semiconductor device such as copper, aluminum, titanium nitride, tungsten, and combinations thereof.

Additional conductive material may be present on or above the substrate 102 as well as the contact electrodes 104A, 104B. For example, anchor electrodes 106A, 106B are shown in FIG. 1, as are numerous additional electrical contacts 108. The anchor electrodes 106A, 106B are the electrodes for the beam structure 114, and the electrical contacts 108 may be used for pull-in electrodes. The anchor electrodes 106A, 106B and the electrical contacts 108 may be comprised of any conductive material suitable for use in a semiconductor device such as copper, aluminum, titanium nitride, tungsten, and combinations thereof.

A dielectric layer 110 is present over the substrate 102, including over the electric contacts 108. It is contemplated that the dielectric layer 110 encompasses an electrically insulating material such as silicon oxide, silicon dioxide, silicon nitride, silicon oxynitride, or combinations thereof.

A first sacrificial layer 112 is present over the dielectric layer 110. The first sacrificial layer 112 will ultimately be removed to free the beam structure 114. The first sacrificial layer 112 comprises a different material than the dielectric layer 110. Suitable material for the first sacrificial layer 112 includes spin-on material such as a carbon based material. The first sacrificial layer 112 may comprise carbon, hydrogen, nitrogen, and oxygen.

A second dielectric layer 110 is present over the first sacrificial layer 112, and the bottom portion of the beam structure 114 is present over the second dielectric layer 110. The second dielectric layer 110 may comprise the same material as the first dielectric layer 110. The beam structure 114 may comprise any conductive material suitable for use in a semiconductor device such as copper, aluminum, titanium nitride (TiN), tungsten, titanium aluminum nitride (TiAlN), tantalum nitride (TaN), and combinations thereof. The beam structure 114 additionally includes a middle portion, a top portion, and post portions. Dielectric layers 110 are present on the top and bottom surfaces of the beam portions.

Additionally, in the areas where the beam structure 114 is not located, additional sacrificial material 112 is present. The sacrificial material 112 may comprise the same material in all locations within the MEMS device 100. In fact, sacrificial material 112 is present over the top portion of the beam structure 114. On and in contact with the topmost sacrificial material 112, an additional dielectric layer 110 is present. A pull-up electrode 116 is present over and on the additional dielectric layer 110. A dielectric roof 118 is also present over the pull-up electrode 116. Release holes 120 are present through the dielectric roof 118 and the top-most dielectric layer 110. The release holes 120 extend through the roof 118 to expose the sacrificial material 112.

The bottom of the beam structure 114 comprises two beam contact portions 122 that comprise ruthenium. Two electrical contact stacks containing contact surface 124 of ruthenium are present over each contact electrode 104A, 104B and aligned with the two beam contact portions 122. The contact surfaces 124 comprising ruthenium are the landing location for the beam structure 114, as will be discussed later. The beam contact portions 122 contact the contact surfaces 124 when the beam structure 114 has been freed and is in the pulled-down state, which is the maximum capacitance state. One or more additional electrical contact stacks containing contact surface 126 of ruthenium are disposed over a portion of the electrical contacts 108.

Figure 2:
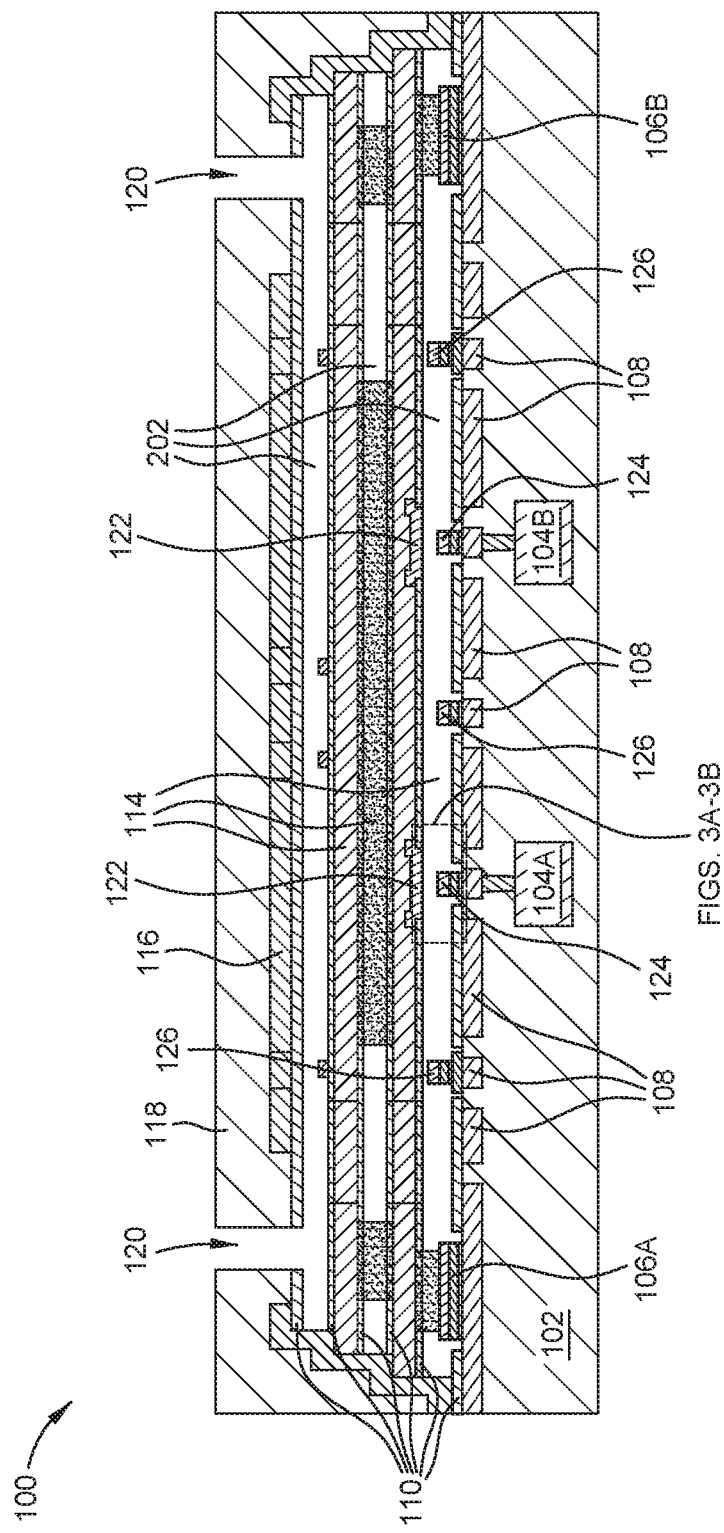
FIG. 2 is a schematic illustration of the MEMS device of FIG. 1 after the sacrificial material has been removed and the beam has been released.

In order to free the beam structure 114 to move the device 100, the sacrificial material needs to be removed. FIG. 2 is a schematic illustration of the MEMS device 100 of FIG. 1 after the sacrificial material 112 has been removed and the beam 114 has been released. The sacrificial material 112 is removed by an etching process where the etchant, which may be a wet etchant or a dry etchant, is introduced through the release holes 120. Once the sacrificial material 112 is removed, the location where the sacrificial used to be is considered to be a cavity 202.

The beam structure 114 is free to move within the cavity 202 once the sacrificial material 112 is removed. The beam structure 114 may move from a first position spaced from both the pull-up electrode 116 and the electrical contact stacks containing contact surface 124 of ruthenium (shown in FIG. 2) back and forth as needed to a second position in contact with the contact surfaces 124 and a third position disposed adjacent to the pull-up electrode 116 and spaced a greater distance from the contact surfaces 124 than in the first position. The terms "first position", "second position", and "third position" are not intending to be limiting, and the beam structure 114 may move to and from any of the three positions in any order.

As noted above, the sacrificial material 112 is removed, but everything else in the device 100 remains. Thus, the contact surfaces 124, 126 are now exposed as are the contact portions 122 that contain ruthenium. As additionally noted above, ruthenium has low resistance and is a durable contact, but ruthenium contacts are susceptible to potential stiction events over operating life. Hence, it has been surprisingly found that additional treatment of the ruthenium will lead to less stiction and further lower the contact resistance of the device.

The ruthenium comprising elements of the device 100 (i.e., the beam contact portions 122 and the contact surfaces 124, 126) may be treated with a fluorine-based treatment. For example, a plasma containing fluorine and oxygen may be optionally introduced to the cavity 202 through the release holes 120. In one embodiment, the plasma is formed from $O_2$ and $CF_4$. It is contemplated that other fluorine based gases may be used such as $NF_3$, $SF_6$, and $CHF_3$. In one embodiment, a Fluorocarbon-based Self Assembled Monolayer (SAM) may be utilized. Thus, the disclosure is not to be limited to $CF_4$. An excessive amount of $C_xF_y$ polymer formation formed during the introduction of the fluorine-based treatment may increase contact resistance to an unacceptable level. Excessive fluorine doping of ruthenium may increase contact resistance to an unacceptable level. Thus, as little polymer formation as possible is desired to maintain low contact resistance.

Figure 3A:
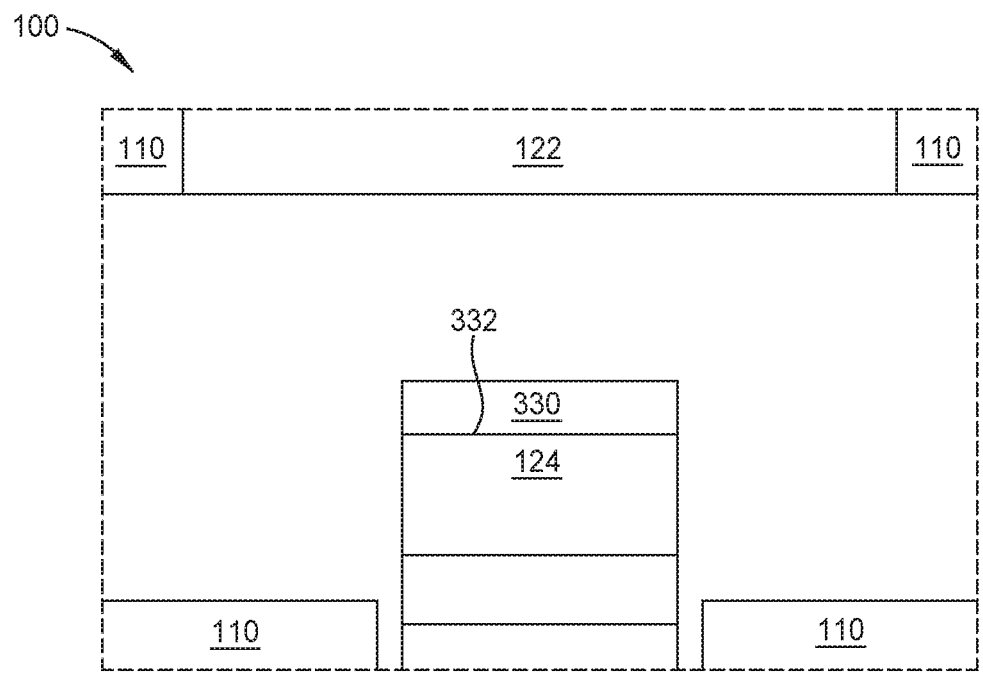
FIG. 3A is a zoomed-in schematic illustration of a portion of the MEMS device of FIG. 2 after the sacrificial material has been removed.

FIG. 3A is a zoomed-in schematic illustration of a portion of the MEMS device 100 of FIG. 2 after the sacrificial material 112 has been removed and/or after the optional fluorine-based treatment. As shown in FIG. 3A, an interstitial layer 330 or layer of residue may be disposed on the top surface 332 of the contact surface 124. The interstitial layer 330 or layer of residue may form on the contact surfaces 124, 126 during the various formation operations of the MEMS device 100, such as during fabrication or construction, during removal of the sacrificial material 112, or during the optional fluorine-based treatment.

Following the optional fluorine-based treatment, a chlorine (Cl) etch process is performed. In one embodiment, the chlorine etch process is performed prior to the optional fluorine-based treatment. Thus, the optional fluorine-based treatment may occur before or after the chlorine etch process. The chlorine etch process may occur following the removal of the sacrificial material 112. Etchant comprising chlorine, such as hydrochloric acid (HCl), boron trichloride ($BCl_3$), or chlorine gas ($Cl_2$), is introduced to cavity 202 through the release holes 120. The chlorine etch-back process may be a "wet" or a "dry" process. In addition to chlorine, the dry etch-back process may include oxygen and/or a combination of oxygen and fluorine. The chlorine containing etchant has high etch selectivity such that the etchant etches only ruthenium comprising elements of the device 100 and residues such as the interstitial layer 330. Thus, the chlorine containing etchant etches a portion of the contact electrode surfaces 124, 126 and/or a bottom portion of the beam contact surfaces 122 without etching the beam structure 114 or the dielectric layers 110. The chlorine containing etch-back process has a very high selectivity (20:1) towards dielectrics, titanium, titanium nitride, and titanium aluminum nitride, which enables the etch-back process to selectively etch-back the contact electrode surfaces 124, 126 without negatively impacting other components inside the cavity.

Figure 3B:
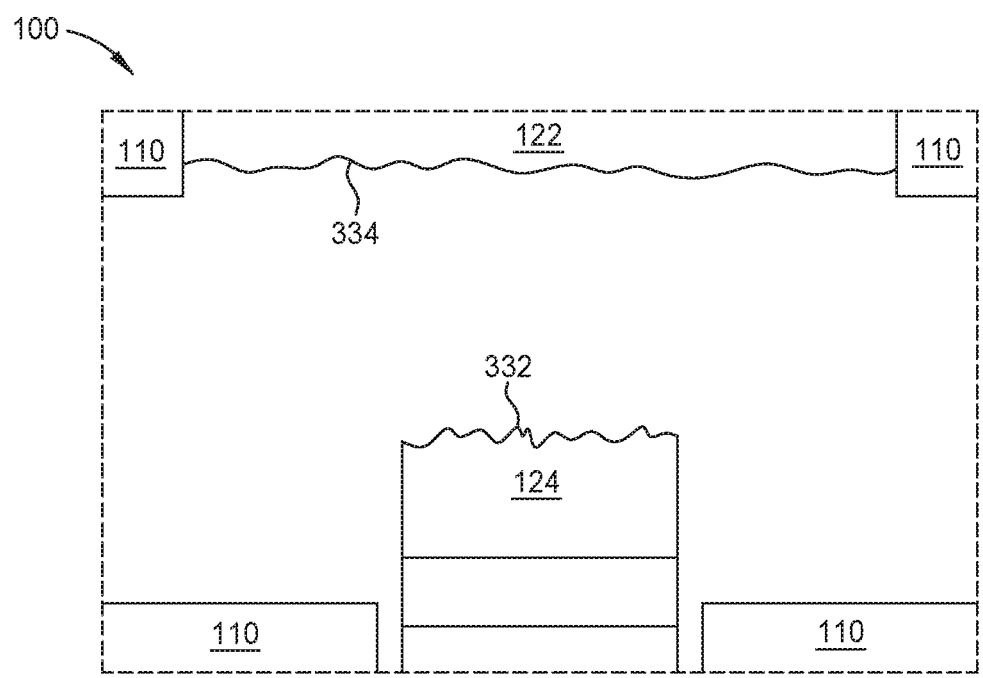
FIG. 3B is a zoomed-in schematic illustration of the MEMS device of FIG. 2 after the exposed ruthenium comprising elements of the device have been etched-back.

FIG. 3B is a zoomed-in schematic illustration of the MEMS device 100 of FIG. 2 after the exposed ruthenium comprising elements of the device 100 (i.e., the beam contact portions 122 and the contact surfaces 124, 126) have been etched. In FIG. 3B, a top portion or surface 332 of the contact surfaces 124, 126 and a bottom portion or surface 334 of the beam contact portions 122 have been partially removed through the chlorine etch process. While FIG. 3B illustrates the removal of ruthenium from both the contact surfaces 124, 126 and the beam contact portions 122, the removal may occur only to the contact surfaces 124, 126, only to the beam contact portions 122, or to both the contact surfaces 124, 126 and the beam contact portions 122.

Etching a bottom portion or surface 334 of the beam contact portions 122 recesses the beam contact portions 122 into the beam structure 114, and etching a top portion or surface 332 of the contact surfaces 124, 126 reduces the overall height of the contact electrodes. As shown in FIG. 3B, the exposed ruthenium comprising elements etched during the chlorine etch process (i.e., the top surface 332 of the contact surfaces 124, 126 and/or the bottom surface 334 of the beam contact portions 122) may have a surface with elevated roughness. In other words, the top surface 332 of the contact surfaces 124, 126 and/or the bottom surface 334 of the beam contact portions 122 have a surface roughness from being etched with the etchant containing chlorine. In one embodiment, the top surface 332 and the bottom surface 334 each have a roughness root mean square of about 1 nm to about 10 nm, such as about 2 nm to about 5 nm. The surface roughness may increase with extended exposure of the surfaces 332, 334 to the etchant containing chlorine. Moreover, following the chlorine etch process, any residues or interstitial layers 330 that may have formed during formation of the device 100 are removed from the exposed ruthenium comprising elements by pumping an inert gas, such as argon, into the cavity.

The chlorine containing etchant has a ruthenium etch rate of about 2 nm/min to about 10 nm/min, such as about 4 nm/min, and a selectivity ratio for etching ruthenium to surrounding exposed materials, such as oxide, TiAlN, and TiN, of about 20:1 to about 25:1 (i.e., the chlorine containing etchant may etch ruthenium 20 to 25 times faster than the chlorine containing etchant etches oxide, TiAlN, and TiN). The etchant containing chlorine may be present in the cavity 202 for about 1 minute to 5 minutes, such as about 2.5 minutes to 3 minutes. The chlorine etch process may remove about 5 nm to 15 nm of ruthenium from each of the contact surfaces 124, 126 and the beam contact portions 122. By etching the ruthenium from the contact surfaces 124, 126 and the beam contact portions 122, the contact resistance of the MEMS device 100 is effectively lowered. In one embodiment, the chlorine etching process lowers the contact resistance of the device 100 by a factor of about 2 as compared to conventional MEMS devices.

Etching a portion of the contact surfaces 124, 126 from each of the electrical contact stacks and/or a portion of each beam contact portion 122 cleans the ruthenium surfaces that were in contact with the sacrificial material 112. The chlorine etch process further removes any residues, interstitial layers, or interstitial impurities that may have formed on the surfaces while forming the MEMS device 100, such as during fabrication or construction, during removal of the sacrificial material 112, or during the optional fluorine containing plasma treatment. For example, the chlorine etch process may remove any $C_xF_y$ polymer formation that may have formed during the optional fluorine containing plasma treatment.

Figure 4:
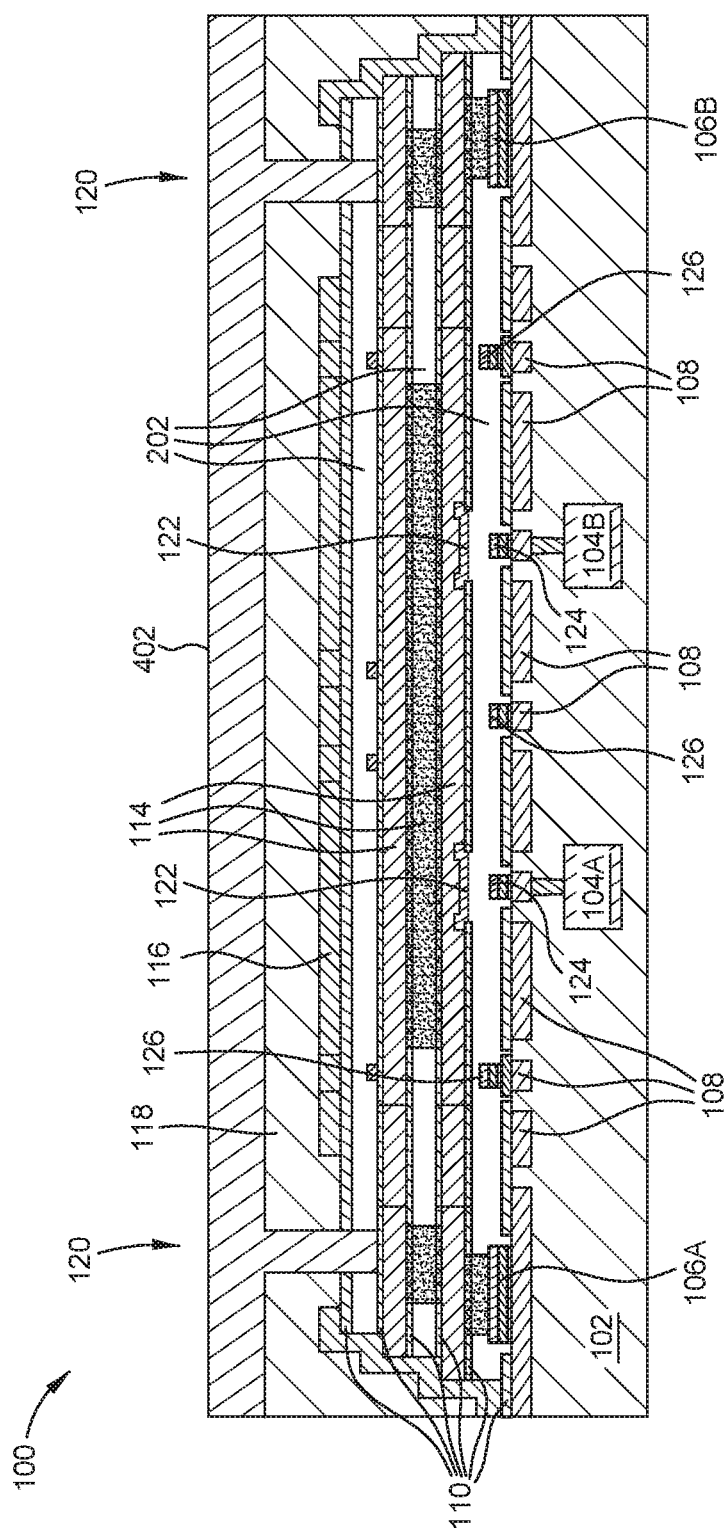
FIG. 4 is a schematic illustration of the MEMS device of FIG. 3B after the MEMS device has been sealed.

Once the sacrificial material 112 has been removed and the exposed ruthenium has been treated, the device 100 is ready to be sealed. FIG. 4 is a schematic illustration of the MEMS device 100 of FIG. 3B after the MEMS device has been sealed. As shown in FIG. 4, a seal 402 is formed to seal the release holes 120. The seal 402 extends down to contact the top-most dielectric layer 110 disposed on the beam structure 114. The seal 402 may comprise a dielectric material such as silicon oxide, silicon dioxide, silicon nitride, silicon oxynitride, or combinations thereof.

By treating the exposed ruthenium surfaces after the sacrificial material has been removed, the resulting MEMS device will have contact surfaces that have low resistance, are durable, and are less susceptible to stiction events.

In one embodiment, a method of manufacturing a MEMS device comprises: forming one or more electrical contact stacks comprising a contact surface of ruthenium within a cavity; forming a beam structure over the one or more electrical contact stacks within the cavity, wherein the cavity contains sacrificial material; removing the sacrificial material from the cavity to free the beam to move within the cavity; etching a portion of the contact surface of ruthenium using an etchant comprising chlorine; and sealing the cavity.

The etchant may further comprise oxygen or fluorine based gasses. The etchant may be present in the cavity for a period of between about 2.5 minutes and 3 minutes. About 5 nm to about 15 nm of the contact surface of ruthenium may be removed through the etching. The beam structure may include at least one contact portion comprising ruthenium. The etching the portion of the contact surface of ruthenium using the etchant comprising chlorine may further comprise etching a bottom portion of the at least one contact portion comprising ruthenium. Etching the portion of the at least one contact portion comprising ruthenium may recess the at least one contact portion comprising ruthenium into the beam structure. The MEMS device may include at least one contact electrode. At least one of the one or more electrical contact stacks comprising the contact surface of ruthenium may be formed over the at least one contact electrode.

The method may further comprise introducing a plasma containing fluorine and oxygen into the cavity prior to etching the portion of the contact surface of ruthenium using the etchant comprising chlorine. The etchant comprising chlorine may comprise hydrochloric acid, boron trichloride, or chlorine gas. The etching the portion of the contact surface of ruthenium using the etchant comprising chlorine may further remove any residues or interstitial layers from the contact surface of ruthenium. The etchant comprising chlorine may have an etch rate of about 4 nanometers per minute to about 6 nanometers per minute. The etchant comprising chlorine may have a selectivity ratio for etching ruthenium to oxide or titanium aluminum nitride of about 20:1.

Those skilled in the art will recognize improvements and modifications to the preferred embodiments of the present disclosure. All such improvements and modifications are considered within the scope of the concepts disclosed herein and the claims that follow.

What is claimed is:

1. A method of manufacturing a MEMS device, comprising:
    forming one or more electrical contact stacks comprising a contact surface of ruthenium, at least one of the one or more electrical contact stacks formed over at least one contact electrode;
    placing a sacrificial material over the one or more electrical contact stacks;
    forming a beam structure over the one or more electrical contact stacks so that the one or the more electrical contacts contact stacks are formed within a cavity that is filled with the sacrificial material;
    removing sacrificial material to free the beam structure to move within a cavity, wherein at least one contact portion of the beam structure is capable of contacting the contact surface of the at least one contact electrode;
    etching a portion of the contact surface of ruthenium within the cavity using an etchant comprising chlorine; and
    sealing the cavity.

2. The method of claim 1, wherein the etchant further comprises oxygen or fluorine based gasses.

3. The method of claim 1, wherein the etchant is present in the cavity for a period of between about 2.5 minutes and 3 minutes.

4. The method of claim 1, wherein about 5 nm to about 15 nm of the contact surface of ruthenium is removed through the etching.

5. The method of claim 1, wherein the beam structure includes at least one contact portion comprising ruthenium.

6. The method of claim 5, wherein the etching the portion of the contact surface of ruthenium using the etchant comprising chlorine further comprises etching a bottom portion of the at least one contact portion comprising ruthenium.

7. The method of claim 6, wherein etching the portion of the at least one contact portion comprising ruthenium recess the at least one contact portion into the beam structure.

8. The method of claim 1, further comprising introducing a plasma containing fluorine and oxygen into the cavity prior to etching the portion of the contact surface of ruthenium using the etchant comprising chlorine.

9. The method of claim 1, wherein the etchant comprising chlorine comprises hydrochloric acid, boron trichloride, or chlorine gas.

10. The method of claim 1, wherein the etching the portion of the contact surface of ruthenium using the etchant comprising chlorine further removes any residues or interstitial layers from the contact surface of ruthenium.

11. The method of claim 1, wherein the etchant comprising chlorine has an etch rate of about 4 nanometers per minute to about 6 nanometers per minute.

12. The method of claim 1, wherein the etchant comprising chlorine has a selectivity ratio for etching ruthenium to oxide or titanium aluminum nitride of about 20:1.

* * * * *